United States Patent
Tsern et al.

(10) Patent No.: US 7,003,639 B2
(45) Date of Patent: *Feb. 21, 2006

(54) MEMORY CONTROLLER WITH POWER MANAGEMENT LOGIC

(75) Inventors: Ely K. Tsern, Los Altos, CA (US); Ramprasad Satagopan, San Jose, CA (US); Richard M. Barth, Ashland, OR (US); Steven C. Woo, Saratoga, CA (US)

(73) Assignee: Rambus Inc., Los Altos, CA (US)

( * ) Notice: Subject to any disclaimer, the term of this patent is extended or adjusted under 35 U.S.C. 154(b) by 13 days.

This patent is subject to a terminal disclaimer.

(21) Appl. No.: 10/873,670

(22) Filed: Jun. 21, 2004

(65) Prior Publication Data

US 2004/0230739 A1 Nov. 18, 2004

Related U.S. Application Data (63) Continuation of application No. 10/369,301, filed on Feb. 18, 2003, now Pat. No. 6,754,783, which is a continuation of application No. 09/907,338, filed on Jul. 16, 2001, now Pat. No. 6,523,089.

(60) Provisional application No. 60/219,358, filed on Jul. 19, 2000.

(51) Int. Cl.
*G06F 12/00* (2006.01)

(52) U.S. Cl. ............... 711/154; 711/5; 711/105; 711/118; 713/300; 713/320; 713/323

(58) Field of Classification Search ............ 711/5, 711/105, 118, 154; 713/300, 320, 323
See application file for complete search history.

(56) References Cited

U.S. PATENT DOCUMENTS

| 5,913,067 | A | | 6/1999 | Klein ................. 713/300 |
| 6,038,673 | A | * | 3/2000 | Benn et al. ........... 713/323 |
| 6,052,789 | A | | 4/2000 | Lin ................... 713/300 |
| 6,125,422 | A | * | 9/2000 | May .................... 711/5 |
| 6,216,233 | B1 | | 4/2001 | Bawesa ............... 713/322 |
| 6,282,604 | B1 | | 8/2001 | May .................... 711/5 |
| 6,523,089 | B1 | * | 2/2003 | Tsern et al. ........... 711/118 |

* cited by examiner

*Primary Examiner*—Mano Padmanabhan
*Assistant Examiner*—Mehdi Namazi
(74) *Attorney, Agent, or Firm*—Morgan, Lewis & Bockius LLP (57) ABSTRACT

A memory controller controls access to, and the power state of a plurality of dynamic memory devices. A cache in the memory controller stores entries that indicate a current power state for a subset of the dynamic memory devices. Device state lookup logic responds to a memory access request by retrieving first information from an entry, if any, in the cache corresponding to a device address in the memory access request. The device state lookup logic generates a miss signal when the cache has no entry corresponding to the device address. It also retrieves second information indicating whether the cache is currently storing a maximum allowed number of entries for devices in a predefined mid-power state. Additional logic converts the first and second information and miss signal into at least one command selection signal and at least one update control signal. Cache update logic updates information stored in the cache in accordance with the at least one update control signal. Command issue circuitry issues power state commands and access commands to the dynamic memory devices in accordance with the at least one command selection signal and the address in the memory access request.

21 Claims, 6 Drawing Sheets

MEMORY CONTROLLER WITH POWER MANAGEMENT LOGIC

This application is a continuation of U.S. utility patent application no. 10/369,301, filed Feb. 18, 2003, now U.S. Pat. No. 6,754,783 which is a continuation of U.S. utility patent application Ser. No. 09/907,338, Jul. 16, 2001, now U.S. Pat. No. 6,523,089 B2, which claimed priority to U.S. provisional patent application 60/219,358, filed Jul. 19, 2000.

The present invention relates generally to memory controllers for controlling and managing access to dynamic memory devices, and particularly to power management logic for enabling the memory controller to maximize memory performance while keeping total energy usage within a predefined budget or minimized (e.g., for battery-operated systems).

BACKGROUND OF THE INVENTION

The main memory of a computer, mobile device, or other computer controlled system may be populated by a number of DRAM (dynamic random access memory) devices, such as Rambus "Direct RDRAM" devices. In some applications there is a need to limit the amount of power drawn by the memory devices, either to conserve power, limit thermal heat dissipation, or both. Many DRAM devices, including Rambus Direct RDRAM devices, support multiple modes of operation, each with a distinct performance/power/latency characteristic. Lower power states are typically characterized by higher latencies, because of the time required for the memory device to return from the low power state to a normal mode of operation. Table 1 lists states, power consumed in each state, and the corresponding latency to exit the state (and thus to return to the Active state), for a typical Direct RDRAM device, circa 2000.

TABLE 1

Power States for Direct RDRAM Devices

| State | Power | Latency to Exit |
| --- | --- | --- |
| Active | 1.95 W | NA |
| Active Idle | 0.36 W | NA |
| Standby | 0.25 W | 20 ns |
| Nap | 0.01 W | 130 ns |
| Power Down | 0.0025 W | 10 $\mu$s |

In some non-portable system configurations with adequate cooling, power management may not be required, and all the DRAM devices not currently being accessed could be kept in the Active Idle state.

A dynamic random access memory (DRAM) contains an array of storage elements, often called memory cells, each storing one bit of data. At the lowest level, these elements are organized into rows and columns, where one row may be accessed at a time. From the row, certain columns are selected to perform a read or write operation.

Figure 1:
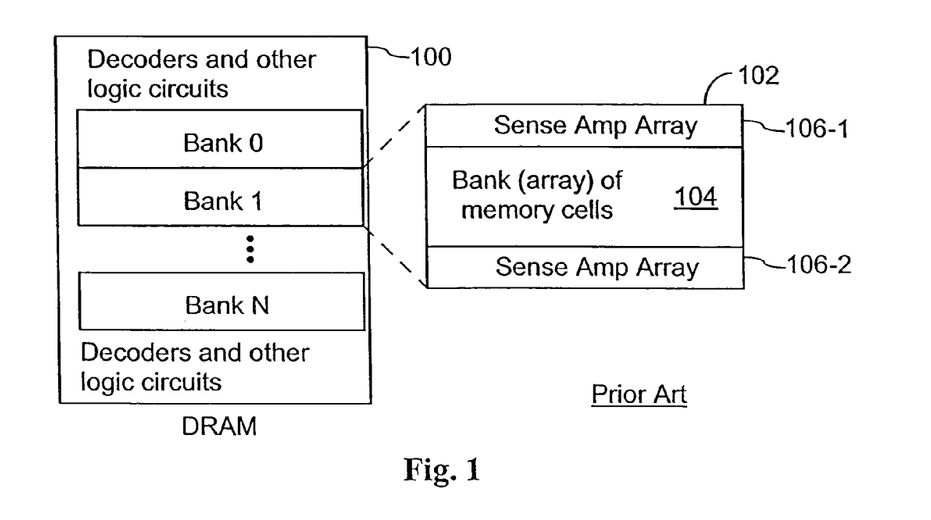
FIG. 1 is a block diagram of a dynamic random-access memory device having independent banks.

Referring to FIG. 1, a single DRAM device 100 may contain multiple internal storage arrays organized as banks 102. A bank 102 is a storage array 104 and its associated sense amp (sense amplifier) arrays 106. The memory array in a 64 Mbit Rambus DRAM (RDRAM) typically contains 16 banks. Each unique device, bank, and row combination is called a page.

Banks in a DRAM can be independent or dependent. Independent banks each have their own sense amp arrays, independent of all other banks. Each bank can operate independently of its adjacent banks.

An independent bank can be in one of two states: open or closed. An open bank has had the contents of one row transferred to a sense amp array, from where it may be rapidly accessed by a so-called column operation. Access to a closed bank requires a row operation to transfer the contents of the desired row to the sense amp cache before the column operation, and is much slower than access to an open bank.

Figure 2:
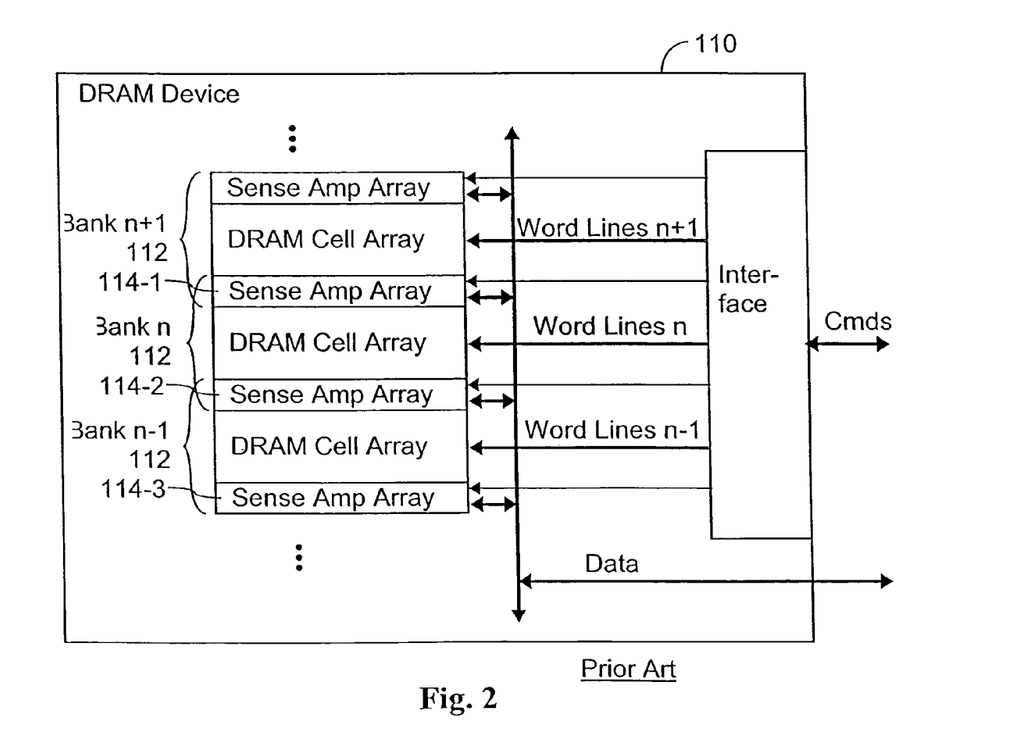
FIG. 2 is a block diagram of a dynamic random-access memory device having dependent banks.

Referring to FIG. 2, there is shown a DRAM device 110 having dependent banks 112. As shown, dependent banks share adjacent sense amp arrays 114. For instance, neighbor banks n and n+1 share the sense amp array positioned between the DRAM cell arrays for those two banks. This reduces the area occupied by sense amplifiers because only N+1 sense amp arrays are required, instead of the 2N sense amp arrays used in the device of FIG. 1, where N is the number or banks. But because it shares sense amp arrays with adjacent banks (called neighbor banks or just neighbors), a dependent bank cannot operate independently of its neighbors. When a dependent bank accesses its sense amp arrays, its neighbors must be closed.

A dependent bank that is closed and has a neighbor open is said to be locked. Locked banks cannot be opened until all neighbor banks are closed. As a convenience, the DRAM's internal logic is arranged so that a precharge operation on any locked bank will also close any open neighbor banks. In other words, whenever a bank is precharged, its associated sense amps are precharged. If neighbor banks are open, their sense amps are precharged as well. If the locked bank is an edge bank at the end of the bank array, up to three sense amp arrays may be precharged, and otherwise up to four sense amp arrays may be precharged. A locked bank can be accessed by a precharge operation, a row operation, and then a column operation.

Still referring to FIG. 2, a bank set is a set of two or three dependent banks. The banks at each end in a DRAM device having a dependent bank organization form a bank set with two banks, because they do not share one of their sense amp arrays. All other banks in the DRAM device must form a bank set with three banks, because they share both associated sense amp arrays.

The present invention provides a memory controller apparatus and method to control a set of DRAM devices. Each DRAM device may be composed of several dependent banks. Among other tasks, the memory controller is responsible for its managing and tracking the state of each bank in the system: open, closed, or (for dependent banks only) locked. From a general perspective, two types of bank control policies that a memory controller could use for managing the bank state of the banks in a multiple bank DRAM are open-page and closed-page.

The closed-page policy is to close (i.e., precharge) the bank used in a memory access operation after every access. This is simplest because there is no need to track the state of any banks other than those being used in memory access operations that have not yet finished. If a bank is not being used, it is closed.

The open-page policy would leave each page (i.e., row of a bank) open as long as possible. If subsequent requests frequently select the same page (this is the case for many applications) row operations are avoided and performance is improved. How long the page can be left open is limited by two factors: bank dependencies (only one page may be open in a bank at a time, and a dependent bank must be closed before opening its neighbor) and the ability of the memory controller to track which banks are open.

SUMMARY OF THE INVENTION

A memory controller controls access to, and the power state of a plurality of dynamic memory devices. A cache in the memory controller stores entries that indicate a current power state for a subset of the dynamic memory devices. Depending on the memory devices, the number of possible power states will vary, but will generally includes at least a first (active) state, a second (mid-power) state, and a third (low power) state, where the second power state uses less power than the first power state, and the third power state uses less power than the second. The cache entries include, at most, a second predefined maximum number of entries specifying dynamic memory devices in the second, mid-power state. The cache entries may also include, at most a first predefined maximum number of entries specifying dynamic memory devices in the first power state (e.g., the Active state). Alternately stated, a first subset of the memory devices are assigned to a first pool (herein called the "active pool") having no more than the first predefined number of devices and a second subset of the memory devices are assigned to a second pool ("the standby pool) having no more than the second predefined number of devices. The first and second pools correspond to the Active and mid-power states of the memory devices. All memory devices not assigned to the active and standby pools are assigned to a low power (nap) state.

Device state lookup logic responds to a memory access request by retrieving first information from an entry, if any, in the cache corresponding to a device address in the memory access request. The device state lookup logic generates a miss signal when the cache has no entry corresponding to the device address. It also retrieves fullness information indicating whether the active pool is full and whether the standby pool is full.

Additional logic converts the first information, fullness information and miss signal into at least one command selection signal and at least one update control signal. Cache update logic updates information stored in the cache in accordance with the at least one update control signal. Command issue circuitry issues power state commands and access commands to the dynamic memory devices in accordance with the at least one command selection signal and the address in the memory access request.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

As indicated in the summary, depending on the particular memory devices being controlled, the number of possible power states and the exact definition of those power states will vary, but will generally includes at least a first (active) state, a second (mid-power) state, and a third (low power) state, where the second power state uses less power than the first power state, and the third power state uses less power than the second. While the invention will be described with respect to Active, Standby and Nap states, in other implementations these power states may be replaced by first, second and third power states, as well as other additional power states, whose definitions are different from those of Active, Standby and Nap.

Figure 3:
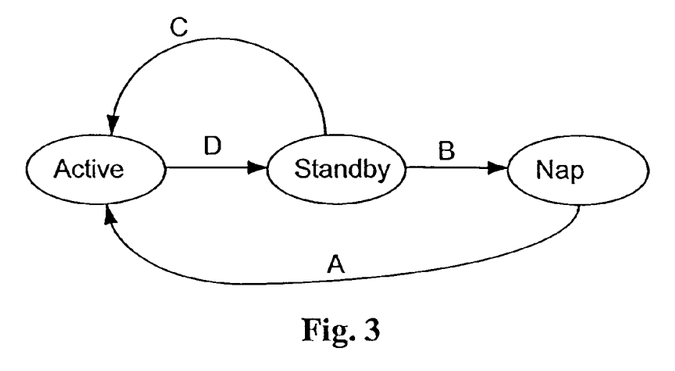
FIG. 3 is a state transition diagram for a memory device.

Referring to FIG. 3, a memory device in the Active state may be "relaxed" to the Standby state to reduce power consumption, and then put in a Nap state to further reduce power consumption. Any memory device in the Standby state may transition directly to the Active state, by issuing a Sense command to it. A device in the Nap state must be sent a wake up command prior to sending it a Sense command. The events associated with power state transitions between Active, Standby and Nap are summarized in Table 2. Standby may be considered to be a "mid-power" state, while Nap may be considered to be a lower power state.

TABLE 2

Power State Transition Events

| State | Entry into State | Exit from State |
| --- | --- | --- |
| Active | Memory request to a device. | End of memory transaction (Precharge) or relax command |
| Standby | End of transaction (Precharge) | Transition to Active when there is a memory request to the device (Activate Command) Transition to Nap |
| Nap | Reset/Initialization | Exit Nap. Transition to Active Transition from Standby |

Memory Controller

Figure 4:
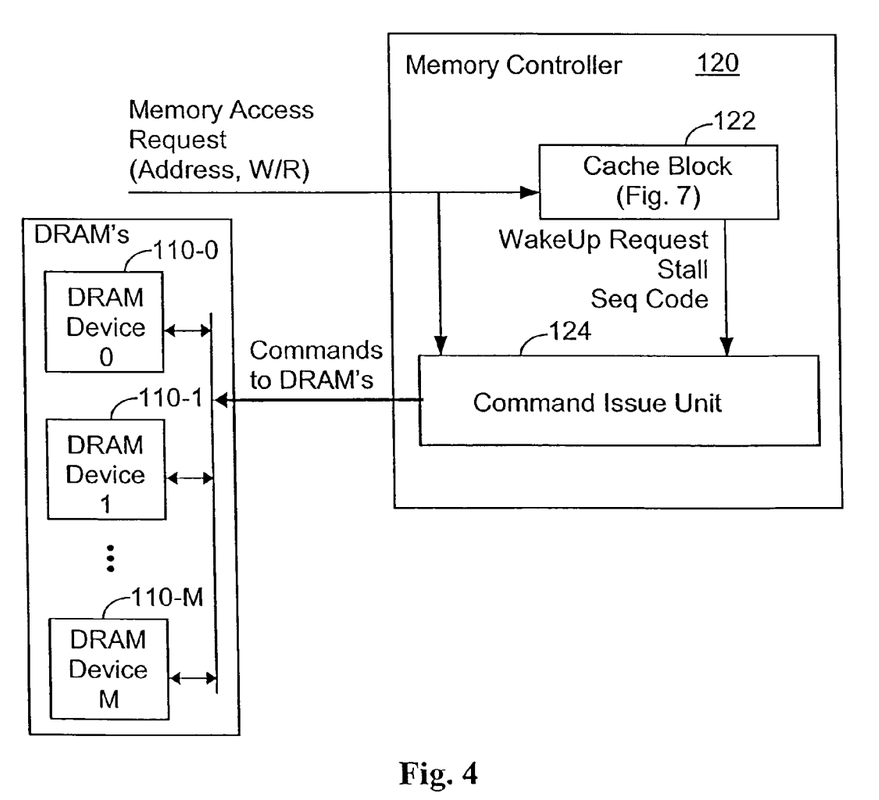
FIG. 4 is a block diagram of a memory system in accordance with the present invention.

Referring to FIG. 4, there is shown a memory controller 120 for controlling a plurality of dynamic memory devices (DRAM's) 110. As discussed above, each DRAM device 110 has a plurality of banks of memory cells and the memory controller 120 is specially configured to optimize performance. In particular, the memory controller 120 enables efficient page mode access whenever a memory access request is directed at a memory bank that is open and the row to which the memory access request is directed is already stored in a sense amp array for that bank.

The memory controller 120 has a cache 122 and a command issue unit 124. The contents and organization of the cache 122 are discussed in more detail below. The purpose of the cache is to store information about the status of a subset of the memory devices 110 being controlled by the memory controller 120. For instance, the cache 122 can be used to store information about the memory devices in Standby, or the memory devices in the Active state as well as those in the Standby state.

The memory controller 120 can be used with DRAM's having either dependent banks or independent banks of memory cells.

Figure 5:
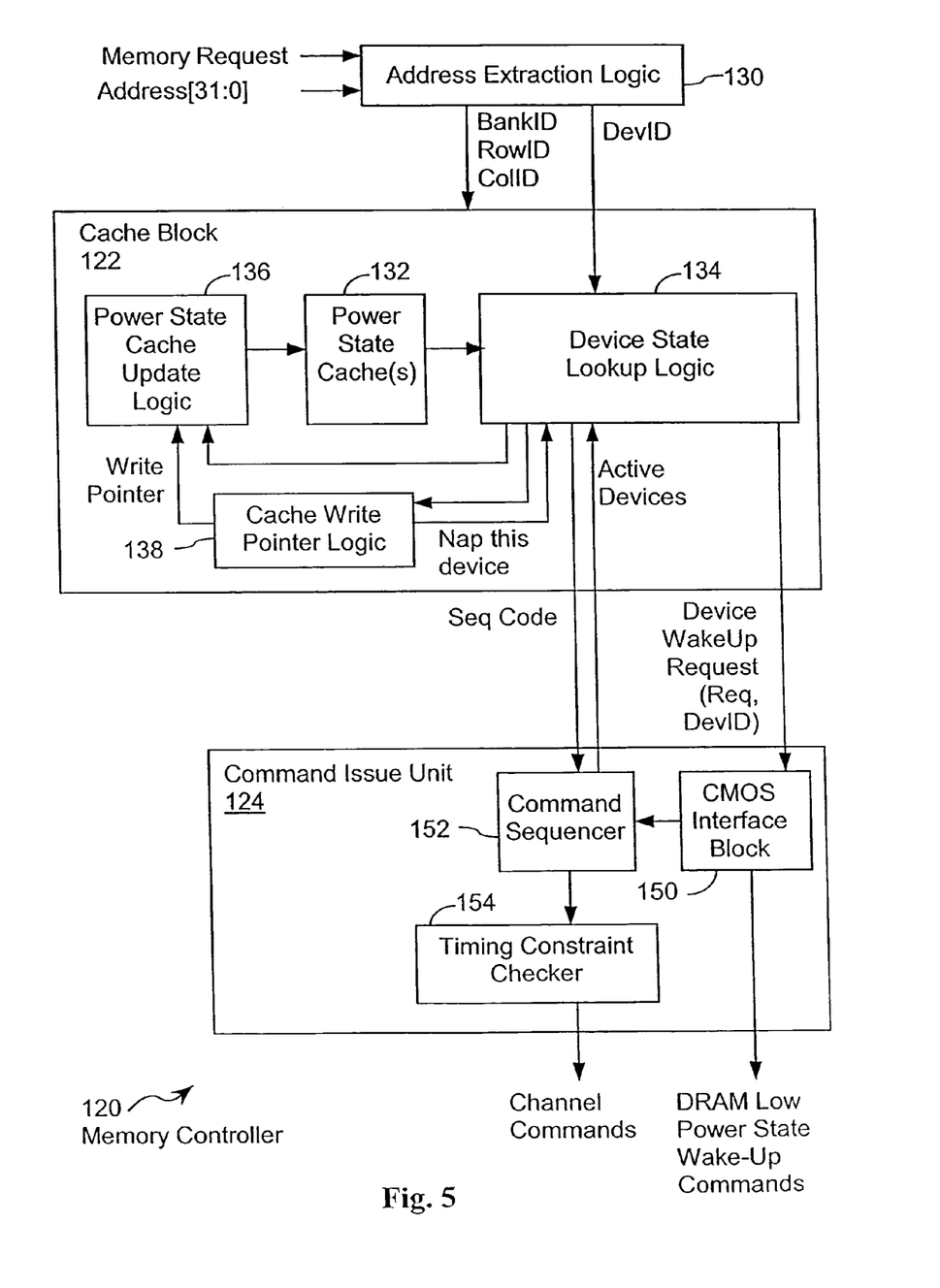
FIG. 5 is a block diagram of a memory controller in accordance with the present invention.

Referring to FIG. 5, the memory controller 120 is shown in more detail. This architecture of the memory controller 120 as shown in FIG. 5 applies to both the closed page policy and open page policy embodiments discussed below.

An address extraction unit 130 receives memory requests and extracts from those requests information needed by the memory controller, including the Device ID, Bank ID, Row ID, Column ID and the type of memory request. The Device ID indicates which memory device is to be accessed, the Bank ID indicates which bank of the device is being addressed, and the Row and Column ID's indicate a specific page and memory cell (or word), respectively, within the identified bank.

In the cache block 122, one or more fully associative caches 132 store device state information about the memory devices. In the closed page policy embodiment, a single cache is used to store information identifying the memory devices in Standby, while in the open page policy embodiment two cache structures are used to store information about the memory devices in Standby as well as those in the Active state.

Device state lookup logic 134 reads information from the cache(s) 132. The information read includes: information from the cache entry, if any, corresponding to the Device ID in a memory request, a hit/miss signal to indicate if there are any matching entries in the cache, as well information about the fullness of the cache. Additional logic within the device state lookup logic 134 generates one or more command selection signals that instruct the command issue unit 124 on how to handle the memory request, and update control signals that are used to facilitate updating of the cache.

The command selection signals are discussed below with reference to the command issue unit 124. The update control signals generated by the additional logic of the device state lookup logic 134 are received by power state cache update logic 136 and cache write pointer logic 138. The power state cache update logic 136 writes data into selected entries of the cache 132, while the cache write pointer logic 138 determines which entries of the cache 132 are to be written or overwritten with new values.

For instance, when the cache 132 is not full, the cache write pointer logic 138 selects an unused cache entry and generates a corresponding write pointer that it sends to the power state cache update logic 136. When an entry is to be evicted from the cache 132, for instance because a memory device currently in Standby is to be transitioned to the Nap state, the cache write pointer logic 138 selects the memory device that is to be put into the Nap state, and generates a corresponding write pointer that it sends to the power state cache update logic 136. In the open page policy embodiment, it is sometimes necessary to update two cache entries while processing a memory request, in which case the cache write pointer logic 138 generates two write pointers during successive cache update periods.

The cache write pointer logic 138 determines which device, if any, is to be put into the Nap state by determining which cache entry to evict. When the cache write pointer generated by the cache write pointer logic 138 is used to access the cache 132, a "Nap this device" signal is also sent by the cache write pointer logic 138 to the device state lookup logic 134. The device state lookup logic 134 receives the Device ID currently stored in the cache entry to be evicted and uses that Device ID to generate and send a Nap sequence command to the identified device.

The command issue unit 124 includes an interface block 150, which sends "wake up" commands to the memory devices for the purpose of wakening them from the Nap state. A command sequencer 152 generates a sequence of memory access commands in accordance with a sequence code received from the cache block 122. The sequence command is used to indicate, for instance, whether a precharge operation is required before a sense operation is to be performed. The sequence command is also used to indicate whether a precharge operation is to be performed at the conclusion of a memory access operation.

A timing constraint checker 154 controls the flow of commands from the command sequencer 152 to the memory devices so as to ensure that all time constraints associated with the memory devices are satisfied. In other words, if the command sequencer 152 attempts to send commands to a memory device faster than compatible with a particular timing constraint, the timing constraint checker 154 delays the issuance of one or more of the commands until the applicable time constraints have been satisfied. The timing constraint checker 154 is the subject of U.S. patent application Ser. No. 09/346,682, filed Jul. 2, 1999, which is hereby incorporated by reference.

Closed Page Policy Power Management

In closed page policy memory controllers, a precharge command is always issued to close each bank after if has been accessed. By simply issuing a "relax" command jointly with a precharge command, any device that is active can be put in the Standby state, thereby lowering the amount of power consumed.

Additional power reduction can be achieved by maintaining some devices in the Nap state. Thus there will be a set of devices in Standby, another set in Nap, and only the devices that are being accessed will be in the Active state. Based on the number of outstanding transactions supported by the controller, a small number of devices will be moved to the Active state to satisfy the memory requests. When the transactions complete, the memory controller sends precharge and relax commands to those devices to put them back into the Standby state so as to conserve power. However, if during the execution of a first memory request, a second memory request is received that is directed to the same memory device as the first memory command, the issuance of the relax command may be delayed until the second memory request has been executed.

Conceptually, in this embodiment, a subset of the memory devices are assigned to a "standby pool" having no more than a predefined number of devices, such as four or eight. All memory devices not assigned to the standby pool, and which are not currently active, are assigned to a low power nap state.

Figure 6:
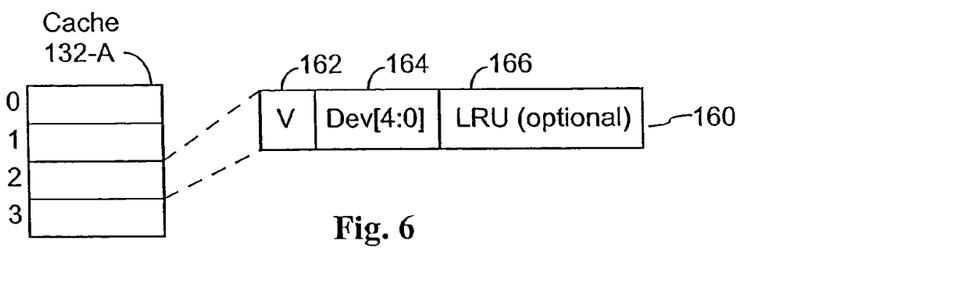
FIG. 6 depict a cache used to store memory device status information in a closed page policy embodiment of the present invention.

A small cache 132-A (FIG. 6) is used to track devices in the Standby state. For instance, in a system having sixteen or thirty two dynamic memory devices, a cache having four or eight entries 160 may be used, with the number of entries determining the size of the standby pool. Each entry 160 preferably includes a valid bit 162, indicating whether the cache entry is valid (i.e., contains information about a device in Standby), and a Device ID field 164 to indicate the Device ID of a device that is in Standby. Each entry 160 may optionally contain additional information, such as a LRU (least recently used) value 166 to support a LRU cache eviction policy. Alternately, LRU information may be stored in a separate set of one or more registers.

Devices not represented by an entry in the cache are assumed to be in the Nap state. Since devices are not left in the Active state indefinitely, there is no need to track devices in the Active state in the "closed page policy" embodiment of the present invention. The memory controller "remembers" the identity of Active devices indirectly, by having queued a set of commands to be sent to those devices.

Figure 7:
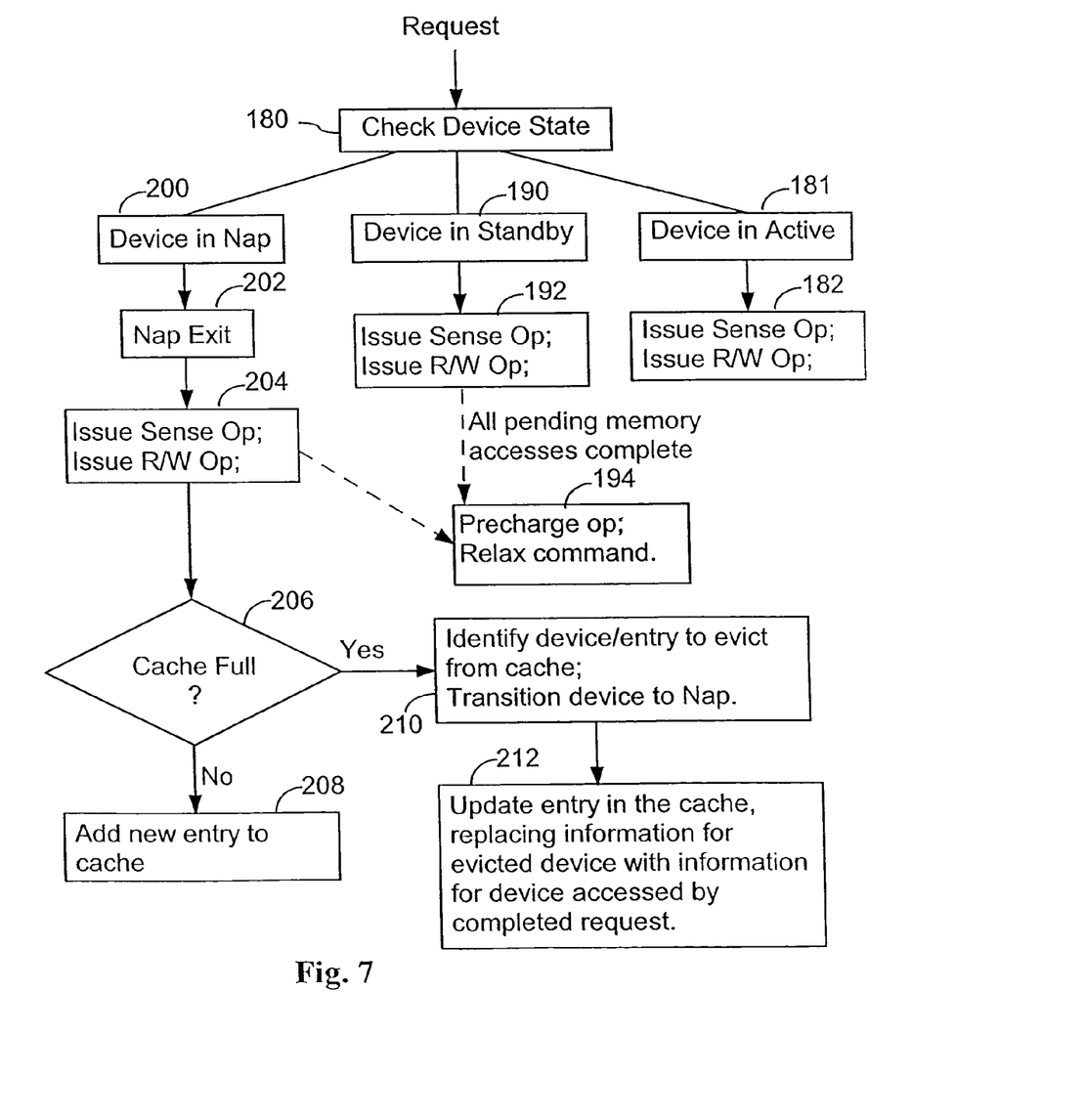
FIG. 7 is a flow chart depicting operation of the memory controller, in response to a memory access request, in accordance with the closed page policy embodiment of the present invention.

Referring to FIG. 7, the memory controller in a preferred closed page policy embodiment operates as follows. When a memory access request is received, the state of the target memory device is checked (180) by reading the entry, if any, corresponding to the device ID of the target memory device. In addition to the cache, the command sequencer 152 of the memory controller also retains information about any other memory transactions that are currently being executed, and thus which memory devices are currently active. The information about active devices is also used by the device state lookup logic to determine what sequence code(s) to send to the command sequencer 152.

If the target device is Active (181), a sense operation command packet, followed by a read or write command packet are sent to the memory device (182) so as to satisfy the memory request. If the memory device is accessing a different page of an open bank of the device than the one requested by the current request, the memory controller issues a precharge command to close the previously accessed page or bank prior to issuing the sense operation command. After all the memory requests for the device are executed, a precharge command is issued to close the last accessed bank and a relax command is issued to return the device to Standby status. However, the precharge and relax commands are not shown in the flow chart for Active status devices because these commands are queued as part of the sequence of operations for devices in Standby or Nap. If the target device is in Standby (190), there is no need to update the contents of the power cache 132, because the target device will only briefly be in the Active state. A sense operation command packet, followed by a read or write command packet is sent to the memory device (192) so as to satisfy the memory request. When all pending memory requests for the device are complete, precharge and relax commands are sent to the memory device so as to return it to the Standby state (194).

If the target device is in the Nap state (200), a Nap exit command is issued 202, and when the device is ready a sense operation command packet followed by a read or write command packet are sent to the memory device (192) so as to satisfy the memory request. When all pending memory requests for the device are complete, precharge and relax commands are sent to the memory device so as to put this device in the Standby state (194). In addition, the cache must be updated to indicate that the target device is now in the Standby state. To do this, the memory controller determines whether the cache is already full (206). If not, a new entry is written to the cache to indicate that the target device is in Standby (208). More specifically, one of the invalid cache entries is selected by the cache write pointer logic 138 (FIG. 5) and the Device ID is written into that entry, along with an enabled Valid bit.

If the cache is full (206-Yes), the number of devices in Standby is already equal to the maximum number of devices allowed to be in Standby, and therefore one device in Standby will have to be put into the Nap state. The cache write pointer logic 138 selects the cache entry to be evicted, generating a corresponding Write Pointer that is then used to access the power state cache 132 (210). In one embodiment, this selection is made the cache write pointer logic 138 using a round robin selection methodology, meaning that cache entries are selected for eviction in strict rotation. In another embodiment, the cache 132 stores information indicating which entry or entries were most recently used. For instance, the cache may store one, two or more values (e.g., cache indices) indicating the most recently used entry or entries of the cache. The cache write pointer logic 138 uses the stored usage information so as to select a "least recently used" entry, which may actually be any entry other than the one or two most recently used entries.

In any case, once the cache write pointer logic 138 selects an entry to evict, the device state lookup logic 134 receives from the cache the Device ID for that entry (which is accessed using the Write Pointer), and sends a Nap sequence code to the command sequencer 152 so as to put the identified device into the Nap state (210). Finally, the entry that was evicted from the cache is replaced by a new entry identifying the target device of the memory request being processed (212).

Open Page Policy Power Management

An open page policy memory controller keeps open previously accessed memory banks, thereby reducing latency when there are multiple accesses to data in a single bank (sometimes called a page) of a device before data in any other bank is accessed. In some instances, an open page policy memory controller can keep track of multiple open banks in a memory device. Of course, as explained above, when the memory devices have dependent banks, only one bank in pair of neighboring banks can be open at a time due to the sharing of sense amplifiers by neighboring banks. The present invention is also applicable to a memory controller for memory devices having independent banks, in which case the state of the bank or banks neighboring the target bank being accessed is not relevant.

Figure 8A:
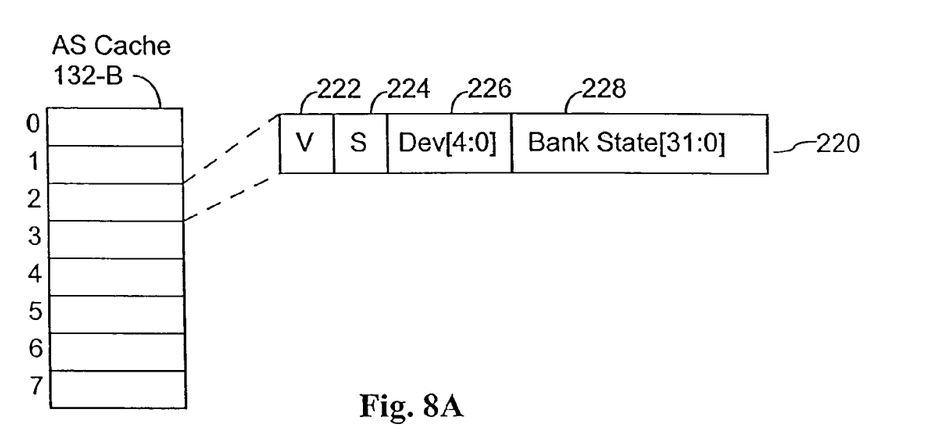
FIGS. 8A and 8B depict two caches used to store memory device status information in a open page policy embodiment of the present invention.
Figure 8B:
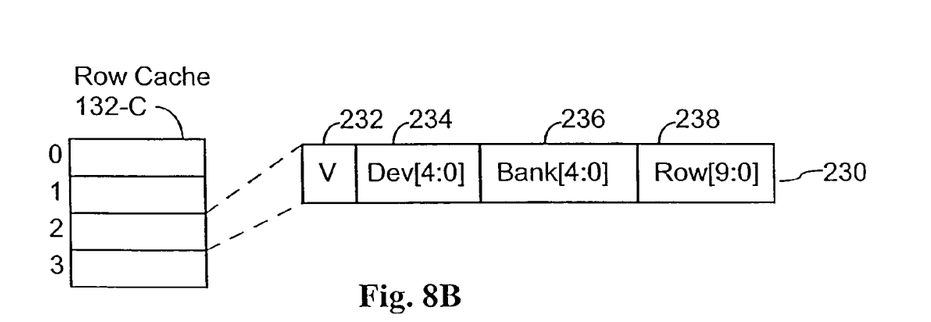

Power management is inherently more complicated in an open page policy memory controller, because of the need to keep track of open banks within the Active devices as well as the need to keep track of which devices are in Standby. In a preferred embodiment, two cache structures 132-B and 132-C are used to store state information for Active and Standby devices, as shown in FIGS. 8A and 8B.

Conceptually, in this embodiment, a first subset of the memory devices are assigned to an "active pool" having no more than a first predefined number (e.g., four) of devices, and a second subset of the memory devices are assigned to a "standby pool" having no more than a second predefined number (e.g., four) of devices. All memory devices not assigned to the active and standby pools are assigned to a low power nap state.

The AS Cache 132-B contains entries 220 that track the power state of the devices not in the Nap state. Each entry 220 stores the following information:

valid bit 222, indicating whether the entry is valid (1) or invalid (0);

a state bit 224, indicating whether the device indicated by the device field 226 is Active (1) or in Standby (0);

a device ID 226, indicating the identifier of the device whose state is indicated by the state bit 224; and a bank state vector (also called a bit map) 228, which has one bit for each bank of the device, with each bit being equal to a first value (e.g., 1) if the corresponding bank is open, and the complementary value (e.g., 0) if the bank is closed.

The AS cache 132-B is accessed through an associative lookup on the Device address field 226. The Device ID of the memory request is compared against all the valid entries in the AS cache 132-B, and if there is a match, a signal is generated to indicate whether the device is in Standby or Active.

The bank state vector 228 is used only for Active devices, since by definition a device in Standby has all its banks closed. The target bank address is used to index into this vector, and three bits of information are accessed: the bits for the target bank and its two neighbors. These three bits are used to determine the sequence of commands to be sent to the target device (See Table 3, Command Sequences).

Each entry 230 of the Row Cache 132-C stores the following information:

valid bit 232, indicating whether the entry is valid (1) or invalid (0);

a device ID 234, indicating the identifier of the device whose open bank is indicated by the Bank field 236;

a Bank field 236, indicating which bank of the device identified by field 234 is open; and a Row field 238, indicating the address of the row that is open in the Device and Bank indicated by the device and bank fields.

In alternate embodiments, the information stored in the Row and AS caches may be stored in a single cache structure. Alternately, a separate cache structure could be used to store information about memory devices in the Standby state, while another is used to store information about devices in the Active state. In yet another embodiment three cache structures may be used: one for memory devices in the Standby state, one for memory devices in the Active state and one for keeping track of open banks.

TABLE 3

Command Sequence for Device in Active State

| Bank State Vector | Condition | Action | Comments |
| --- | --- | --- | --- |
| {0,0,0} | Page Empty | Sense target if number of open banks < max. Otherwise: sense target and close bank of eviction target. | |
| {0,0,1} or {1,0,0} | Adjacent Bank in Use (one neighbor open, one closed) | Close neighboring bank. Sense target. | |
| {1,0,1} | Both Neighbors in Use (both open) | Close neighboring banks. Sense target. | Since both neighbors are in use, two entries in the Row cache must be updated. |
| {0,1,0} | Page Hit | Issue CAS. | No cache updates. |
| {0,1,0} | Page Miss | Close Target (Precharge). Sense Target | Update only Row cache entry to indicate target row. |

Based on the maximum allowed power consumption for the system in which the memory subsystem is to be used, the memory controller is configured to limit the number of memory devices in the Active state to a first specified or predetermined number, and to limit the number of memory devices in Standby to a second specified or predetermined number. For instance, the maximum number of Active devices may be set to four and the maximum number of devices in Standby may be set to four, in which case the AS cache 132-B must have eight entries. The size of the caches and the complexity of the memory controller increases as more devices are allowed to be Active or in Standby. The updating of the entries in the AS Cache 132-B will be discussed below.

The Row Cache 132-C is used to keep track of open banks. That is, there is one entry 230 in the Row Cache 132-C for each open bank within the entire set of memory devices. Thus if there are two open banks in a device, there will be two distinct entries 230 for that device in the Row Cache 132-C one for each open bank. The number of entries 230 in the Row Cache 132-C may be equal to the maximum allowed number of Active Devices, or may be a larger number. Having more entries in the Row Cache 132-C will improve the average latency for memory operations, but will increase the complexity of the memory controller.

In the preferred open page policy embodiment, the Row Cache 132-C is accessed through an associative lookup of the Device and Bank address bits of the memory request being processed. If there is a match, the row bits are compared in the matching entry (or entries) are compared with the row bits of the target address to determine if there is a page hit or page miss. A corresponding page hit/miss signal is generated, and this signal is used to determine which commands to send to the target device.

When a memory request is for a bank that is the neighbor of an open bank, the open bank must be closed before the target bank can be accessed. The entry in the Row cache 132-C for the previously open neighboring bank will be updated with the information for the newly opened bank. When a memory request is for a bank that is the neighbor of two open banks, one on each side, both of the open banks must be closed before the target bank can be accessed. The entry in the Row cache 132-C for one of the previously open neighboring bank will be updated with the information for the newly opened bank, and the entry in the Row cache for the other previously open neighboring bank must be invalided.

The memory controller maintains two eviction pointers in order to keep track of which entries in the caches 132-B and 132-C to evict when the caches are full. When the caches are full and a memory request is for a device and bank not currently represented by a cache entry, it will be necessary to evict an entry in at least one of the caches and to replace it with the appropriate address fields of the current memory request.

Both eviction pointers are generated by the cache write pointer logic 138. The Row cache has an eviction pointer that points to the entry for the bank that needs to be closed. This pointer is updated on a round robin basis, and when the cache is full, it will point to the entry that is to be evicted. The cache write pointer logic 138 also generates an eviction pointer for the AS cache, where an entry for a device in the Standby state is the always the target for eviction. An entry for an active device may be downgraded to the Standby state when the number of active devices exceeds the maximum allowed number. When the number of devices in Standby exceeds the maximum allowed number, an entry for a device in Standby is evicted. This eviction pointer is also updated on a round robin basis in a preferred embodiment, and successively entries for devices in Standby will be chosen to be candidates for eviction. In other embodiments, eviction policies other than round robin (e.g., eviction of the entry for the least recently accessed device) may be used.

Figure 9:
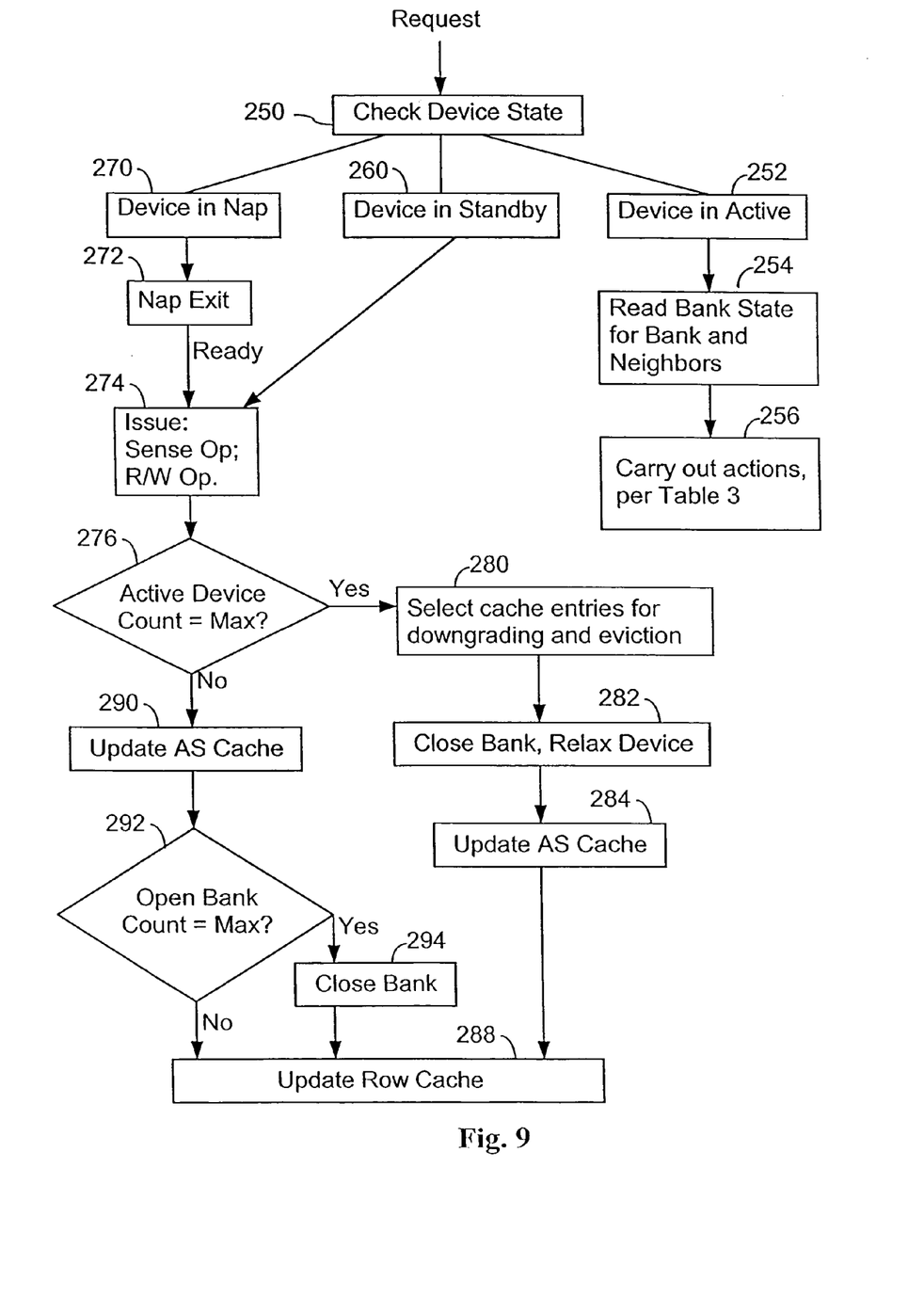
FIG. 9 is a flow chart depicting operation of the memory controller, in response to a memory access request, in accordance with the open page policy embodiment of the present invention.

Referring to FIG. 9, the operation of the memory controller, using an open page policy, in response to a memory request is as follows. When a memory access request is received, the state of the target memory device is checked (250) by reading the AS cache entry, if any, corresponding to the device ID of the target memory device. At the same time, the Row cache is associatively accessed using the device and bank fields of the address in the memory request. Furthermore, during the same cache access operation, signals are generated by the device state logic indicating the fullness of the caches with respect to the maximum number of active device, the maximum number of devices in Standby, and the maximum number of open banks.

If the target device is Active (252), the bank state for the target bank and its neighbors are read (254). Actually, the bank state vector 228 (FIG. 8A) is read from the AS cache simultaneously with the device state information. The three bits corresponding to the target bank and its neighbors are identified and read from this vector and then used to perform a table lookup operation so as to generate a sequence code to be sent to the command sequencer 152 (FIG. 4), in accordance with the actions shown in Table 3 (256).

Referring to Table 3, when the three-bit bank state vector for an Active device is equal to $\{0,0,0\}$, the bank and its neighbors are closed and thus the target bank is ready to be accessed. As a result, a first sequence code will be generated, that instructs the command issue unit to issue a sense (RAS) operation packet followed by a read or write (CAS)operation packet. If the row cache is full, indicating that the number of open banks is equal to its predefined maximum, then an entry in the Row cache is selected for eviction and a second sequence code is generated that instructs the command issue unit to issue a precharge command so as to close the bank identified by the selected Row cache entry. That Row cache entry is then overwritten with information about the target of the current memory request.

If the three-bit bank state vector for an Active device is equal to $\{1,0,0\}$ or $\{0,0,1\}$, the bank is not ready to be accessed because one of its neighbors is open. To handle this, two sequence codes are generated and sent to the command issue unit: one that instructs the command issue unit to close the neighboring bank, and a second that instructs the command issue unit to issue a sense (RAS) operation packet, followed by a read or write (CAS) operation packet. The Row cache entry for the neighboring bank that is being closed is overwritten with information about the target of the current memory request.

If the three-bit bank state vector for an Active device is equal to $\{1,0,1\}$ the bank is not ready to be accessed because both of its neighbors are open. To handle this situation, three sequence codes are generated and sent to the command issue unit: first and second sequence codes instruct the command issue unit to close the left and right neighboring banks, and a third sequence code instructs the command issue unit to issue a sense (RAS) operation packet, followed by a read or write (CAS) operation packet. The Row cache entry for one of the neighboring banks that is being closed is overwritten with information about the target of the current memory request, while the Row cache entry for the other of the neighboring banks is invalidated by the cache block's update logic 136 (FIG. 5).

If the three-bit bank state vector for an Active device is equal to $\{0,1,0\}$, the target bank is open. If the row specified by the memory request matches the row specified by the corresponding Row cache entry, then this is a called a Page Hit, because the target page is already stored in the sense amplifiers of the target memory device. In this case, a sequence code is generated and sent to the command issue unit to issue a read or write (CAS) operation packet. No cache updates are needed. If, however, the row specified by the memory request does not match the row specified by the corresponding Row cache entry, then this is a called a Page Miss, because the target page is not stored in the sense amplifiers of the target memory device. In this case, a sequence code is generated and sent to the command issue unit to issue Precharge packet to close the page, followed by a sense (RAS) operation and then a read or write (CAS) operation packet. The row value in the Row cache entry for the target bank is updated by the cache block's update logic 136 (FIG. 5).

If the target device is determined to be in Standby (260), there will already be an entry for the target device in the AS cache. In this case a sequence code is generated and sent to the command issue unit to issue a sense (RAS) operation packet, followed by a read or write (CAS) operation packet (274). If the target device is determined to be in the Nap state (270), a Nap exit (wake up) command is sent to the target device (272) and then a sequence code is generated and sent to the command issue unit to issue a sense (RAS) operation packet, followed by a read or write (CAS)operation packet (274).

In addition to sending a sequence code to the command issue unit, when the target device is in the Standby state or the Nap state, a number of steps are taken to update the AS cache and Row cache to reflect the changed state of the target device and well as any devices for which an entry may be evicted from the AS cache or Row cache. If the number of Active devices is already equal to its predefined maximum value (276-Yes), then an entry in the AS cache identifying an Active device is selected for downgrading to the Standby state and a corresponding entry in Row cache is selected for eviction (280). In embodiments in which the number of entries in the Row cache exceeds the maximum number of devices that can be Active, all entries in the Row cache that correspond to the device to be downgraded to the Standby state are selected for eviction. This function may be performed by using dedicated logic to invalid all entries of the Row cache for having a specified Device ID.

If, in addition, the target device is in the Nap state and the number of devices in the Standby state is equal to its predefined maximum value, then an second entry in the AS cache identifying a device in the Standby state is selected for eviction. When the target device is in the Standby state, this second eviction from the AS cache is not needed, because the AS cache entry for the target device will be updated (282) to indicate that the target device is now Active.

One or more sequence codes are generated and sent to the command issue unit so as to close all the open banks of the Active device corresponding to the AS cache entry selected for downgrading (280) and also to relax the selected device to the Standby state (282). In addition two entries of the AS cache are updated to reflect that the target device is now active as well as to reflect the new power state of the device that was downgraded from Active to Standby (284). Further, the Row cache is updated to (A) reflect the closure of one or more banks in the device downgraded from Active to Standby, and (B) identify the target bank of the memory request being processed.

If the number of Active devices is not equal to its predefined maximum value (276-No), the cache update operation is somewhat simpler, because fewer cache entries need to be updated. If the target device was previously in Standby, the AS cache entry for that device is updated to indicate that the target device is now active (290). If the target device was previously in the Nap state, the status information for the target device is written into an empty (i.e., invalid) entry in the AS cache (290). Thus, only one entry in the AS cache needs to be updated, regardless of whether the target device was previously in the Standby state or the Nap state. If, prior to processing the memory request, the number of open banks was equal to its predetermined maximum number (i.e., if the Row cache was full) (292), then one entry of the Row cache is selected and the memory device bank identified by that entry is closed (294). Finally, the Row cache is updated so as to have an entry that identifies the target bank of the memory request being processed (288). If the bank was previously full, the Row cache entry used is the one for the bank that was evicted at step 294, and otherwise an empty (i.e., invalid) entry is used.

It should be noted that while operations are shown in FIG. 9 as occurring in a sequential order, when these operations are implemented in circuitry, many of the operations shown are performed in parallel. In particular, cache update operations are performed in parallel with the command issue operations. Furthermore, updates to the Row cache are performed in parallel with updates to the AS cache. As a result, updates to the cache structures are completed within one or three clock cycles, depending on the number of entries to be updated. Each cache entry eviction or downgrade causes a corresponding sequence command to be generated and sent to the command issue unit so as to implement a bank closure (for Row cache evictions) or power state downgrade (for AS cache evictions or downgrades).

Alternate Embodiments

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A memory controller for controlling a plurality of dynamic memory devices, comprising:
   device state logic for determining a power state for each memory device of the plurality of dynamic memory devices, including logic for setting the determined power state of at least one respective memory device to a predefined active power state, for setting the determined power state of a second respective memory device to a predefined low-power state, and for setting the determined power state of a third respective memory device to a predefined mid-power state;
   memory configured to store the power state of at least one memory device of the plurality of memory devices, and to further configured to store open page status information identifying each open page of at least one memory device in the predefined active power state; and
   command issue circuitry configured to issue power state commands to the dynamic memory devices in accordance with the power state determined by the device state logic, wherein the command issue circuitry is configured to issue a mid-power state command to the third respective memory device.

2. The memory controller of claim 1, wherein the device state logic is configured to set the determined power state of a respective memory device to the predefined active power state if a first operating condition is satisfied, to the predefined low-power state if a second operating condition is satisfied, and to the predefined mid-power state if a third operating condition is satisfied.

3. The memory controller of claim 1, wherein the mid-power state uses less power than the active power state, and the low power state uses less power than the mid-power state.

4. The memory controller of claim 1, wherein the command issue circuitry utilizes the open page status information stored in the memory to generate the access commands to the at least one dynamic memory device in the predefined active power state.

5. The memory controller of claim 1, wherein the command issue circuitry utilizes the open page status information stored in the memory to generate the access commands to the at least one dynamic memory device in the predefined active power state, so as to access memory locations in an open page without performing a precharge operation when the memory access request corresponds to memory locations in an open page.

6. A memory controller for controlling a plurality of dynamic memory devices, comprising:
   device state logic for determining a power state for each memory device of the plurality of dynamic memory devices, including logic for setting the determined power state of at least one respective memory device to a predefined active power state, for setting the determined power state of a second respective memory device to a predefined low-power state, and for setting the determined power state of a third respective memory device to a predefined mid-power state; and
   command issue circuitry configured to issue power state commands to the dynamic memory devices in accordance with the power state determined by the device state logic, wherein the command issue circuitry is configured to issue a mid-power state command to the third respective memory device;
   wherein the memory controller implements a predefined open page policy wherein any page in any of the memory devices that is opened in response to a first memory access request is kept open for possible access by a subsequent memory access request until a predefined page close condition requires the page to be closed.

7. The memory controller of claim 6, including
a cache configured to store open page status information identifying each open page of the plurality of dynamic memory devices in the predefined active state, wherein the command issue circuitry includes additional logic that utilizes the open page status information stored in the cache to generate a command selection signal when an address in a memory access request corresponds to a memory device for which open page status information is stored in the cache.

8. The memory controller of claim 7, wherein the command issue circuitry utilizes the open page status information stored in the cache to generate the access commands to the dynamic memory devices, so as to access memory locations in an open page without performing a precharge operation if the memory access request corresponds to memory locations in an open page.

9. A memory controller, comprising:
memory configured to store a power state for at least one memory device in a memory system having a plurality of memory devices, wherein the power state is from a set of power states including a first power state, a second power state and a third power state, wherein the power states are associated with different levels of power supplied to the memory device; and
a command issue circuit coupled to the memory and the plurality of memory devices, the command issue circuit configured to transition the a respective memory device of the plurality of memory devices between power states based at least in part on a memory access request associated with the respective memory device;
wherein the memory is further configured to store open page status information identifying each open page of at least one memory device in the first power state, and wherein the command issue circuit includes logic that utilizes the open page status information stored in the memory when a memory access request corresponds to a memory device for which open page status information is stored in the memory.

10. The memory controller of claim 9, wherein the first power state is an active power state, the second power state is a mid-power state and the third power state is a low power state.

11. The memory controller of claim 9, wherein the command issue circuit is configured to transition the respective memory device between power states based at least in part on a power management policy.

12. The memory controller of claim 11, wherein the power management policy is an open-page policy.

13. The memory controller of claim 11, wherein the power management policy is a closed-page policy.

14. The memory controller of claim 9, wherein the memory is configured for storing entries that indicate a current power state for at least a subset of the plurality of memory devices, wherein some of the entries include a maximum number of entries specifying memory devices in a second power state.

15. The memory controller of claim 14, wherein the command issue circuit issues power state commands and access commands to the respective memory device in accordance with at least one command selection signal and an address in a memory access request associated with the memory device.

16. A method of controlling the power states of a plurality of memory devices in a memory system using a memory controller, comprising:
at the memory controller:
receiving a memory access request;
determining a current power state of at least one memory device of the plurality of memory devices, wherein the current power state of a respective memory device is determined from a set of power states including a low power state, a mid-power state and an active state;
determining an open/closed page status of the respective memory device when the memory access request corresponds to a memory device in the active state; and
when memory access request corresponds to a memory device not in the active state, issuing a power state command to the memory device, wherein the power state command causes the memory device to transition to a new power state different from the current power state.

17. The method of claim 16, wherein the new power state is determined at least in part by a power management policy.

18. The method of claim 17, wherein the power management policy is an open-page policy.

19. The method of claim 17, wherein the power management policy is a closed-page policy.

20. The method of claim 16, wherein determining the memory device's current power state includes retrieving current power state information and fullness information from a cache, wherein the fullness information indicates whether the current power state information indicates a maximum number of memory devices that are in a mid-power state.

21. A memory control system for controlling the power states of memory devices in a memory system, the memory control system comprising:
means for receiving a memory access request;
means for determining a current power state for at least one memory device, wherein the current power state is determined from a set of power states including a low power state, a mid-power state and an active state;
means for storing the power state of at least one memory device of the plurality of memory devices, and for storing open page status information identifying each open page of at least one memory device in the predefined active power state; and
means for issuing a power state command to the memory device, wherein the power state command causes the memory device to transition to a new power state different from the current power state.

* * * * *